(12) United States Patent
Ji et al.

(10) Patent No.: US 12,114,428 B2
(45) Date of Patent: Oct. 8, 2024

(54) ELECTRONIC COMPONENT EMBEDDED SUBSTRATE

(71) Applicant: SAMSUNG ELECTRO-MECHANICS CO., LTD., Suwon-si (KR)

(72) Inventors: Yun Je Ji, Suwon-si (KR); Yong Hoon Kim, Suwon-si (KR); Seung Eun Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 79 days.

(21) Appl. No.: 17/943,603

(22) Filed: Sep. 13, 2022

(65) Prior Publication Data
US 2023/0108748 A1  Apr. 6, 2023

(30) Foreign Application Priority Data

Oct. 6, 2021 (KR) .................. 10-2021-0132445

(51) Int. Cl.
*H05K 1/18* (2006.01)
*H05K 1/11* (2006.01)

(52) U.S. Cl.
CPC ............ *H05K 1/183* (2013.01); *H05K 1/113* (2013.01); *H05K 2201/0166* (2013.01); *H05K 2201/09036* (2013.01)

(58) Field of Classification Search
CPC ........ H05K 1/183; H05K 1/164; H05K 1/185; H05K 1/113; H05K 2201/0166; H05K 2201/09036
See application file for complete search history.

(56) References Cited

U.S. PATENT DOCUMENTS

| | | | |
|---|---|---|---|
| 2013/0258623 A1* | 10/2013 | Zeng | H05K 1/186 29/840 |
| 2016/0219712 A1 | 7/2016 | Ko et al. | |
| 2018/0020547 A1* | 1/2018 | Chan | H05K 3/0005 |
| 2020/0152566 A1 | 5/2020 | Oh et al. | |
| 2022/0141959 A1* | 5/2022 | Chocteau | H05K 3/4697 361/748 |

FOREIGN PATENT DOCUMENTS

| | | | | |
|---|---|---|---|---|
| CN | 108601203 A | * | 9/2018 | ........... H05K 1/0204 |
| KR | 10-2016-0091050 A | | 8/2016 | |
| KR | 10-2020-0055415 A | | 5/2020 | |
| KR | 10-2199413 B1 | | 1/2021 | |

* cited by examiner

*Primary Examiner* — Hoa C Nguyen
(74) *Attorney, Agent, or Firm* — MORGAN, LEWIS & BOCKIUS LLP

(57) ABSTRACT

An electronic component embedded substrate includes: an insulating material including a cavity formed in one surface thereof; a protective layer embedded in the insulating material and covering an entire bottom surface of the cavity; solders disposed on side surfaces of the cavity; and an electronic component disposed in the cavity and at least partially in contact with the solders, wherein the protective layer has a material different from that of the insulating material.

20 Claims, 4 Drawing Sheets

ELECTRONIC COMPONENT EMBEDDED SUBSTRATE

CROSS-REFERENCE TO RELATED APPLICATION(S)

This application claims benefit of priority to Korean Patent Application No. 10-2021-0132445 filed on Oct. 6, 2021 in the Korean Intellectual Property Office, the disclosure of which is incorporated herein by reference in its entirety.

TECHNICAL FIELD

The present disclosure relates to an electronic component embedded substrate.

BACKGROUND

In accordance with the recent trend toward weight reduction and miniaturization of mobile devices, the necessity to implement slimness and lightness of electronic component embedded substrates mounted in such mobile devices has gradually increased.

Meanwhile, in accordance with slimming and lightening of mobile devices, in order to meet a technical demand for slimness and lightness of mobile devices, a technology in which electronic components such as integrated circuits (ICs), active elements, or passive elements are inserted into a substrate in terms of shortening of a connection path between electronic components, noise suppression, and the like, has been demanded. Recently, research into a technology of embedding components in a substrate in various manners has been continuously conducted.

In particular, a substrate structure including a cavity has been formed in order to insert various components into a substrate, and a technology using a sandblasting process or the like has been performed in order to form the cavity.

SUMMARY

An aspect of the present disclosure may provide an electronic component embedded substrate including fine circuits and/or micro-vias.

An aspect of the present disclosure may also provide an electronic component embedded substrate in which a high-capacity electronic component is mounted in a cavity.

An aspect of the present disclosure may also provide an electronic component embedded substrate in which a cavity is processed so that a degree of design freedom of an inner layer circuit pattern is increased.

According to an aspect of the present disclosure, an electronic component embedded substrate may include: an insulating material including a cavity disposed in one surface thereof; a protective layer embedded in the insulating material and covering an entire bottom surface of the cavity; solders disposed on side surfaces of the cavity; and an electronic component disposed in the cavity and at least partially in contact with the solders, wherein the protective layer has a material different from that of the insulating material.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
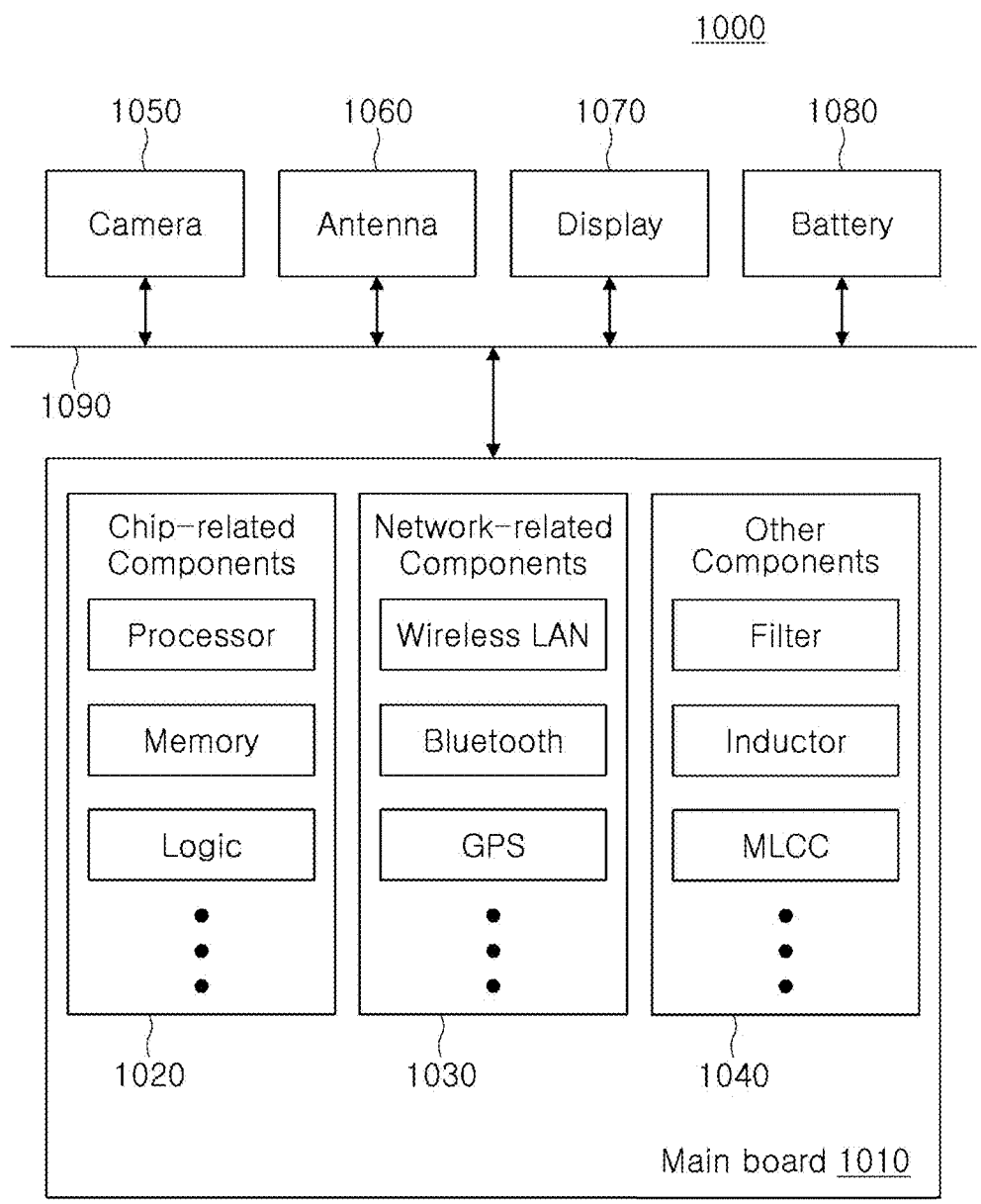
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

In addition, in adding reference numerals to components of the accompanying drawings, the same components will be denoted by the same reference numerals as much as possible even though they are illustrated on different drawings.

In addition, in describing the present disclosure, when it is determined that a detailed description of a known art related to the present disclosure may unnecessarily obscure the gist of the present disclosure, the detailed description thereof will be omitted.

"Disposed on any component" herein is not intended to set a direction. Accordingly, "disposed on any component" may refer to a disposition on an upper side of any component and a disposition on a lower side of any component.

Terms "upper surface", "lower surface", "upper side", "lower side", "uppermost side", and "lowermost side" herein are directions set in the drawings for convenience of explanation. Accordingly, the upper surface, the lower surface, the upper side, the lower side, the uppermost side, the lowest side, and the like, may be described as different terms according to set directions.

A "connection" of a component to another component herein conceptually includes an indirect connection through a third component as well as a direct connection between two components. In addition, "electrically connected" conceptually includes a physical connection and a physical disconnection.

Terms "first", "second", and the like, herein are used to distinguish one component from another component, and do not limit a sequence, importance, and the like, of the corresponding components. In some cases, a first element may be referred to as a second element. Similarly, a second element may also be referred to as a first element.

The term "an exemplary embodiment" used herein does not refer to the same exemplary embodiment, and is used to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other. These chip related components 1020 may have a package form including the chips or the electronic components described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, these other components 1040 are not limited thereto, but may also include chip component types of passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other electronic components may include, for example, a camera 1050, an antenna 1060, a display 1070, a battery 1080, or the like. These other electronic components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
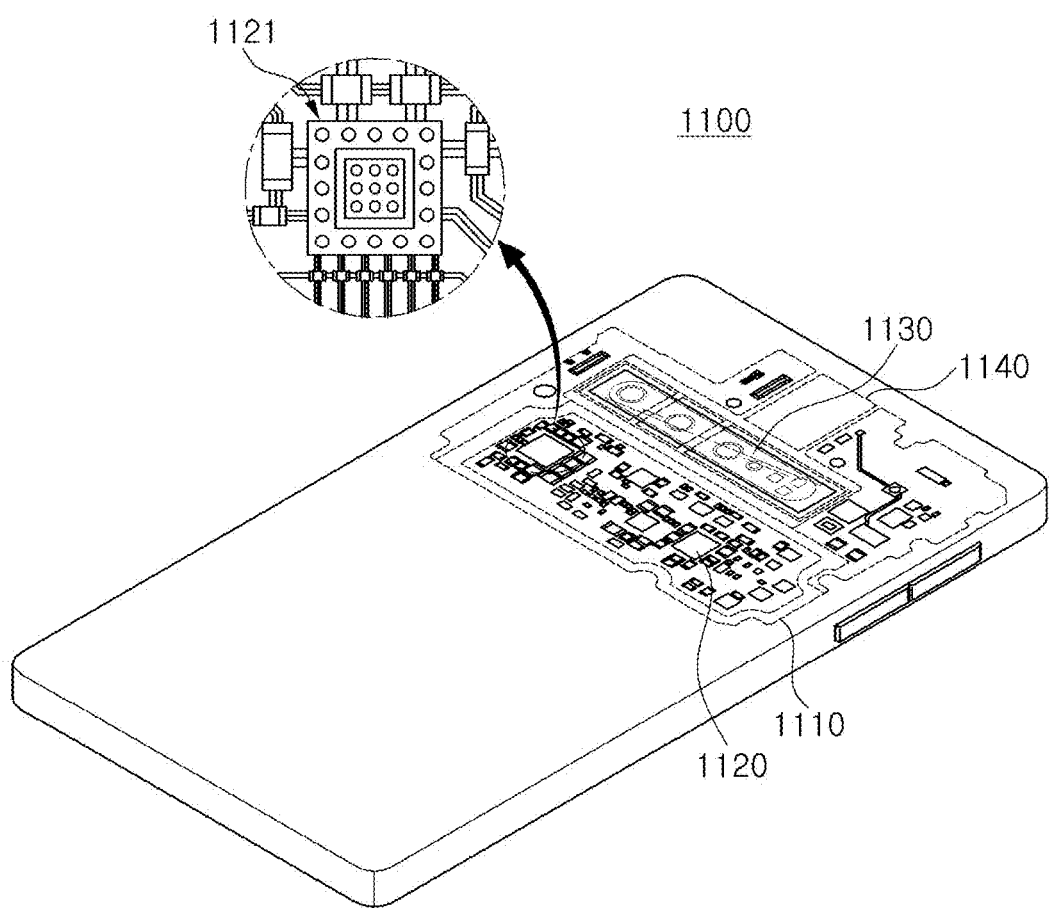
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in the smartphone 1100, and various electronic components 1120 may be physically or electrically connected to the mainboard 1110. In addition, other components that may or may not be physically or electrically connected to the mainboard 1110, such as a camera module 1130 and/or a speaker 1140, may be accommodated in the smartphone 1100. Some of the electronic components 1120 may be the chip related components, for example, an antenna module 1121, but are not limited thereto. The antenna module 1121 may have a form in which an electronic component is surface-mounted on an electronic component embedded substrate, but is not limited thereto. Meanwhile, the electronic device is not necessarily limited to the smartphone 1100, but may be other electronic devices as described above.

Electronic Component Embedding Substrate

Figure 3:
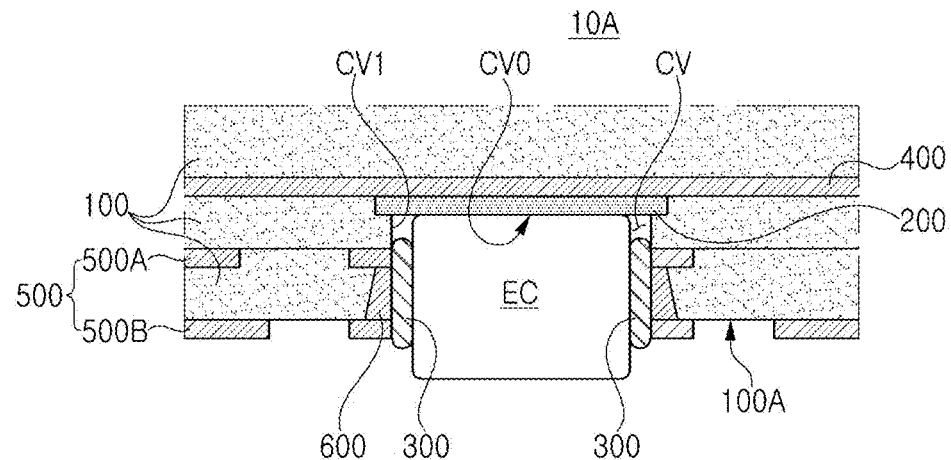
FIG. 3 is a schematic cross-sectional view illustrating an example of an electronic component embedded substrate according to the present disclosure.

FIG. 3 is a schematic cross-sectional view illustrating an example of an electronic component embedded substrate according to the present disclosure.

Referring to FIG. 3, an electronic component embedded substrate 10A according to the present disclosure may include an insulating material 100 including a cavity CV formed in one surface 100A thereof, a protective layer 200 embedded in the insulating material 100 and covering the entire bottom surface CV0 of the cavity CV, and solders 300 disposed on side surfaces CV1 of the cavity CV.

In this case, the protective layer 200 may include a composition different from that of the insulating material 100. For example, the insulating material 100 may include Ajinomoto Build-up Film (ABF) and the protective layer 200 may include a dry film photoresist (DFR), but the present disclosure is not limited thereto.

In addition, the protective layer 200 may be embedded in the insulating material 100, such that at least a portion of each of one surface and both side surfaces of the protective layer 200 may be in contact with the insulating material 100.

In addition, as described later, the protective layer 200 may function as a stopper at the time of processing the cavity CV in one surface 100A of the insulating material 100, but is not limited thereto.

The electronic component embedded substrate 10A according to the present disclosure may further include an electronic component EC disposed in the cavity CV and at least partially in contact with the solders 300.

In addition, the electronic component embedded substrate 10A according to the present disclosure may further include a metal layer 400 embedded in the insulating material 100 and at least partially in contact with the other surface of the protective layer 200 opposing one surface of the protective layer 200.

In this case, the metal layer 400 may be disposed to be spaced apart from the electronic component EC, and the protective layer 200 may be disposed in a space in which the metal layer 400 is spaced apart from the electronic component EC, but the present disclosure is not limited thereto. The protective layer 200 may also not be embedded in the insulating material 100, and the metal layer 400 and the electronic component EC may also be in contact with each other.

In addition, the electronic component embedded substrate 10A according to the present disclosure may include a circuit layer 500 disposed outside or inside the insulating material 100. More specifically, a first circuit layer 500A may be disposed on one surface of the insulating material 100, and a second circuit layer 500B may be embedded in the insulating material 100. In this case, vias 600 connecting the first and second circuit layers 500A and 500B to each other may be formed in the insulating material 100.

In addition, at least portions of the first and second circuit layers 500A and 500B and the vias 600 may be exposed to (or extend from) the side surfaces CV1 of the cavity CV of the insulating material 100, and the exposed (or extended) first and second circuit layers 500A and 500B and vias 600 may be in contact with and connected to the solders 300, but the present disclosure is not limited thereto.

As described above, separate connection pads between the electronic component and the insulating material are not disposed, and the circuit layer 500 and the vias 600 exposed to (or extend from) the side surfaces CV1 of the cavity CV of the insulating material 100 may serve as pads, such that a package substrate may be manufactured to have a small thickness by a height of a solder when the package substrate is manufactured and a fine pitch may be implemented, but a technical effect is not limited thereto.

The insulating material 100 of the electronic component embedded substrate 10A according to the present disclosure may be at least one of a thermosetting resin such as an epoxy resin, a thermoplastic resin such as polyimide, or a resin in which the thermosetting resin or the thermoplastic resin is impregnated together with an inorganic filler in a core material such as a glass cloth (or a glass fabric), such as prepreg, ABF, FR-4, or Bismaleimide Triazine (BT).

In addition, a material of each of the circuit layer 500 and the vias 600 may be a conductive material such as copper (Cu), aluminum (Al), silver (Ag), tin (Sn), gold (Au), nickel (Ni), lead (Pb), titanium (Ti), or alloys thereof, but is not limited thereto.

In addition, each of the first and second circuit layers 500A and 500B and the vias 600 in the electronic component embedded substrate 10A according to the present disclosure may include an electroless plating layer and an electroplating layer. The electroless plating layer may serve as a seed layer for the electroplating layer, but is not limited thereto.

The electroless plating layer and the electroplating layer filling the vias 600 may also include a conductive material such as copper (Cu), aluminum (Al), silver (Ag), tin (Sn), gold (Au), nickel (Ni), lead (Pb), titanium (Ti), palladium (Pd), or alloys thereof.

At least a portion of the second circuit layer 500B protruding from one surface of the insulating material 100 may include a surface treatment layer. The surface treatment layer may include a composition different from that of each of the first and second circuit layers 500A and 500B. For example, each of the first and second circuit layers 500A and 500B may include copper (Cu), and the surface treatment layer may include nickel (Ni) or tin (Sn), but the present disclosure is not limited thereto.

In addition, in the electronic component embedded substrate 10A according to the present disclosure, a solder resist layer covering at least a portion of the second circuit layer 500B in which the surface treatment layer is formed may be further disposed on one surface 100A of the insulating material 100. In this case, the solder resist layer may be formed of a photosensitive material. In addition, a solder resist may have thermosetting and/or photocuring properties, but is not limited thereto.

Figure 4:
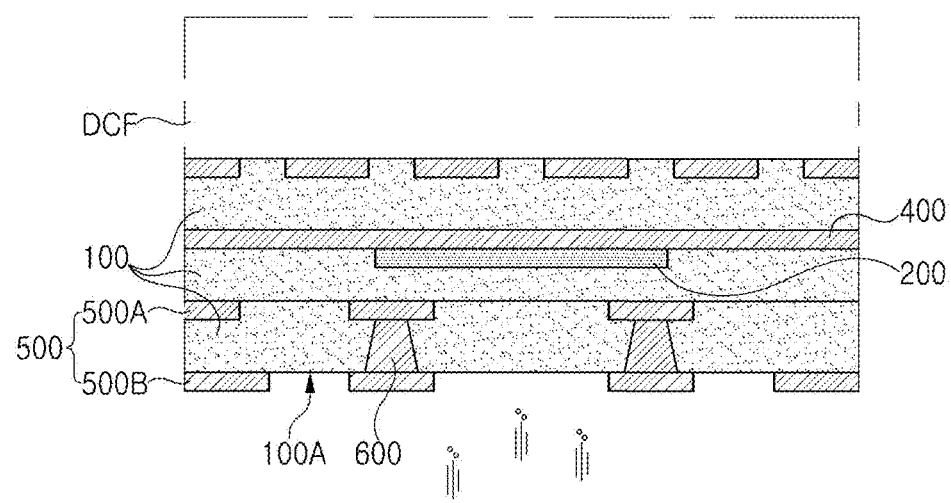
FIG. 4 is a schematic cross-sectional view illustrating a method of manufacturing an electronic component embedded substrate according to the present disclosure.

FIG. 4 is a schematic cross-sectional view illustrating a method of manufacturing an electronic component embedded substrate 10 according to the present disclosure.

Referring to FIG. 4, the electronic component embedded substrate 10 according to the present disclosure may be manufactured by stacking an insulating material 100 in which each of a plurality of insulating layers, circuit patterns, and vias is stacked, on a detach core DCF, and then forming a cavity CV.

More specifically, the cavity CV may be formed in one surface 100A of the insulating material 100 in which the circuit pattern is embedded, using laser processing or a blasting method. In this case, a mask may be disposed in a region where the cavity CV is not formed, but is not limited thereto.

In addition, when the cavity CV is formed, at least portions of circuit layers disposed on both surfaces of the outermost insulating layer of the insulating material 100 and vias connecting the circuit layers disposed on both surfaces of the outermost insulating layer to each other may be polished to be exposed to side surfaces CV1 of the cavity. The circuit layers and the vias exposed to the side surfaces CV1 of the cavity may serve as connection pads connected to the electronic component EC, as described above, but are not limited thereto.

In addition, a depth of the cavity CV is not limited to a depth at which only the outermost insulating layer of the insulating material 100 is processed, but each of the plurality of circuit layers and vias may be exposed to the side surfaces CV1 of the cavity CV by processing the plurality of insulating layers.

In addition, when the cavity CV is formed, the protective layer 200 embedded in the insulating material 100 may function as a stopper. That is, the cavity CV may be formed up to a depth at which the protective layer 200 is formed, but is not limited thereto.

Thereafter, although not illustrated, the electronic component EC may be disposed in the formed cavity CV so as to be in contact with the solders 300 disposed on the side surfaces CV1 of the cavity.

Other components overlap those described above, and a detailed description thereof is thus omitted.

Figure 5:
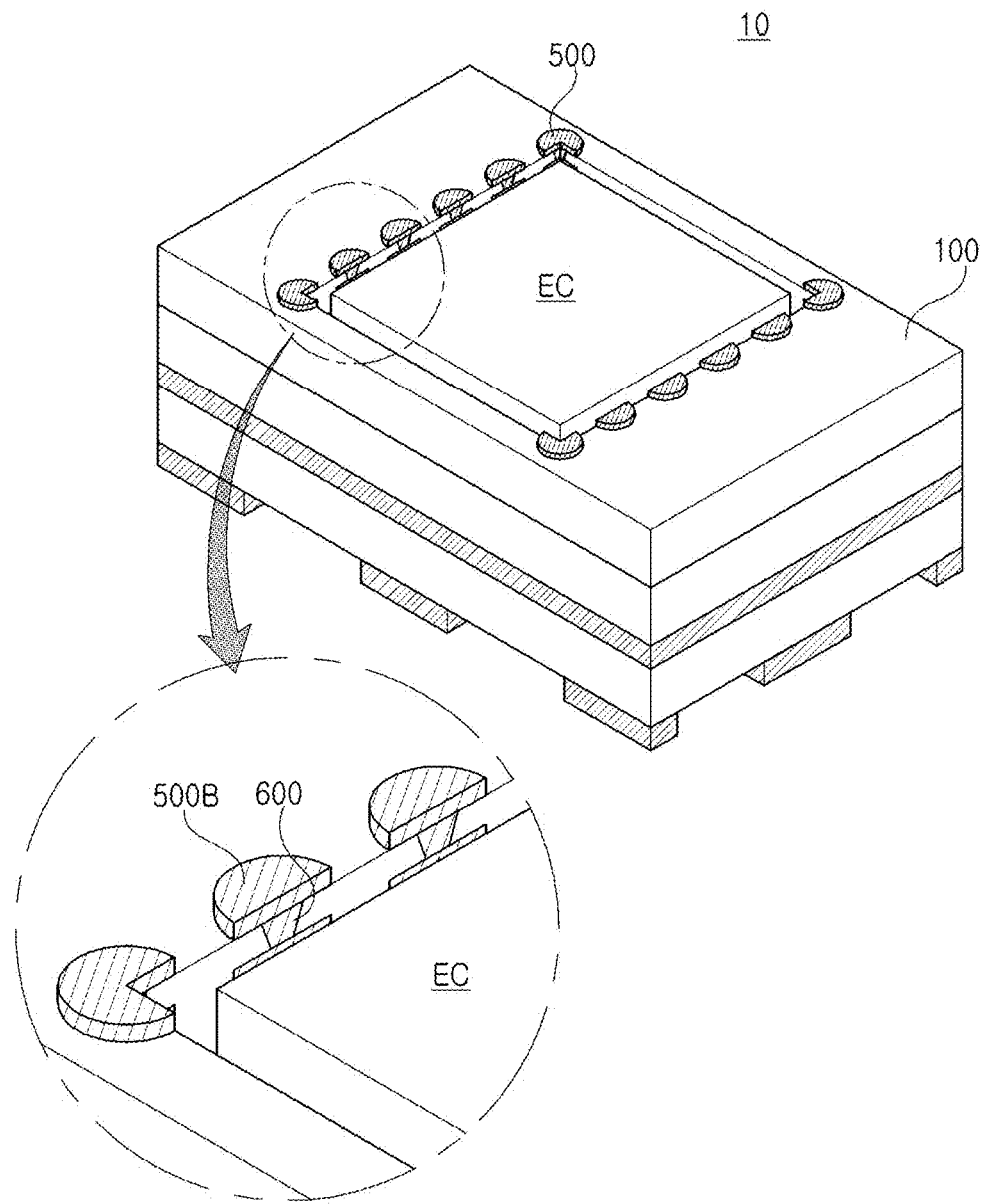
FIG. 5 is a schematic view illustrating an example of an electronic component embedded substrate according to the present disclosure.

FIG. 5 is a schematic view illustrating an example of an electronic component embedded substrate according to the present disclosure.

Referring to FIG. 5, an electronic component embedded substrate 10 according to the present disclosure may include an electronic component EC disposed in a cavity CV formed in one surface of an insulating material 100. The electronic component EC may be electrically connected to solders 300 disposed on side surfaces CV1 of the cavity.

In this case, the solders 300 may be in contact with each of a circuit layer 500 and vias 600 exposed to (or extend from) the side surfaces CV1 of the cavity. In this case, the circuit layer 500 and the vias 600 may serve as connection pads connecting the electronic component EC and the electronic component embedded substrate to each other, but are not limited thereto.

When the electronic component EC is mounted in the cavity CV of the insulating material 100, spaced spaces may be formed between the circuit layer 500 and the vias 600 exposed to the side surfaces CV1 of the cavity and the electronic component EC. The solders 300 may be disposed in such spaced space to connect a substrate and the electronic component EC to each other.

In this case, the circuit layer 500 and the vias 600 exposed to the side surfaces CV1 of the cavity may serve as pads connecting the substrate and the electronic component EC to each other rather than connecting electrical signals to each other, and the vias 600 may be eccentric toward the cavity CV, but the present disclosure is not limited thereto. For example, the via 600 may be eccentric with respect to a side surface of the cavity, and a central axis of the via along a stacking direction of the electronic component embedded substrate 10 may be offset by a distance from the side surface of the cavity.

Unlike the related art in which the electronic component is mounted in the cavity or is stacked on one surface of the substrate by disposing separate connection pads, the circuit layer 500 and the vias 600 may be manufactured to be exposed to the side surfaces of the cavity CV formed in the insulating material 100 of the electronic component embedded substrate 10 according to the present disclosure to serve as connection pads. Therefore, a size of the substrate may be decreased by a thickness of the connection pads, and a height of the solders 300 connecting the substrate and the electronic component to each other may also be decreased, such that a fine pitch may be implemented, but the present disclosure is not limited thereto.

Other components overlap those described above, and a detailed description thereof is thus omitted.

According to an exemplary embodiment in the present disclosure, an electronic component embedded substrate including fine circuits and/or micro vias may be provided.

In addition, an electronic component embedded substrate in which a high-capacity electronic component is mounted in a cavity may be provided.

Further, an electronic component embedded substrate in which a cavity is processed so that a degree of design freedom of an inner layer circuit pattern is increased may be provided.

While exemplary embodiments have been shown and described above, it will be apparent to those skilled in the art that modifications and variations could be made without departing from the scope of the present invention as defined by the appended claims.

What is claimed is:

1. An electronic component embedded substrate comprising:
   an insulating material including a cavity disposed in one surface thereof;
   a protective layer embedded in the insulating material and covering an entire bottom surface of the cavity;
   solders disposed on side surfaces of the cavity; and
   an electronic component disposed in the cavity and at least partially in contact with the solders,
   wherein the protective layer has a material different from that of the insulating material, and
   wherein the protective layer includes an insulative material.

2. The electronic component embedded substrate of claim 1, wherein at least a portion of each of one surface and both side surfaces of the protective layer is in contact with the insulating material.

3. The electronic component embedded substrate of claim 1, further comprising a metal layer embedded in the insulating material and at least partially in contact with the other surface of the protective layer opposing one surface of the protective layer.

4. The electronic component embedded substrate of claim 3, wherein the metal layer is spaced apart from the electronic component.

5. The electronic component embedded substrate of claim 1, further comprising:
   a first circuit layer disposed on one surface of the insulating material;
   a second circuit layer embedded in the insulating material; and
   vias connecting the first and second circuit layers to each other.

6. The electronic component embedded substrate of claim 5, wherein the vias are eccentric toward the cavity of the insulating material.

7. The electronic component embedded substrate of claim 5, wherein at least a portion of each of the first and second circuit layers and the vias extend from at least one of the side surfaces of the cavity of the insulating material.

8. The electronic component embedded substrate of claim 7, wherein at least a portion of each of the first and the second circuit layers and the vias extending from the at least one of the side surfaces of the cavity is in contact with at least one of the solders.

9. The electronic component embedded substrate of claim 1, wherein the protective layer includes a dry film photoresist (DFR).

10. The electronic component embedded substrate of claim 1, further comprising an embedded pattern layer disposed on the other surface of the insulating material opposing one surface of the insulating material.

11. The electronic component embedded substrate of claim 1, wherein the electronic component is in contact with the protective layer.

12. The electronic component embedded substrate of claim 11, wherein an entire surface of the electronic component facing the bottom surface of the cavity is in contact with the protective layer.

13. An electronic component embedded substrate comprising:
   an insulating material including a cavity disposed in one surface thereof;
   a protective layer embedded in the insulating material and covering an entire bottom surface of the cavity;
   solders disposed on side surfaces of the cavity;
   a first circuit layer disposed on one surface of the insulating material;
   a second circuit layer embedded in the insulating material;
   vias connecting the first and second circuit layers to each other; and an electronic component disposed in the cavity and at least partially in contact with the solders, wherein the protective layer has a material different from that of the insulating material, and wherein the vias are eccentric toward the cavity of the insulating material.

14. The electronic component embedded substrate of claim 13, wherein at least a portion of each of one surface and both side surfaces of the protective layer is in contact with the insulating material.

15. The electronic component embedded substrate of claim 13, further comprising a metal layer embedded in the insulating material and at least partially in contact with the other surface of the protective layer opposing one surface of the protective layer.

16. The electronic component embedded substrate of claim 13, wherein the protective layer includes a dry film photoresist (DFR).

17. An electronic component embedded substrate comprising:

an insulating material including a cavity disposed in one surface thereof;

a protective layer embedded in the insulating material and covering an entire bottom surface of the cavity;

solders disposed on side surfaces of the cavity;

a first circuit layer disposed on one surface of the insulating material;

a second circuit layer embedded in the insulating material;

vias connecting the first and second circuit layers to each other; and an electronic component disposed in the cavity and at least partially in contact with the solders, wherein the protective layer has a material different from that of the insulating material, and wherein at least a portion of each of the first and second circuit layers and the vias extend from at least one of the side surfaces of the cavity of the insulating material.

18. The electronic component embedded substrate of claim 17, wherein at least a portion of each of the first and the second circuit layers and the vias extending from the at least one of the side surfaces of the cavity is in contact with at least one of the solders.

19. The electronic component embedded substrate of claim 17, wherein at least a portion of each of one surface and both side surfaces of the protective layer is in contact with the insulating material.

20. The electronic component embedded substrate of claim 17, wherein the protective layer includes a dry film photoresist (DFR).

* * * * *